United States Patent
Vreugdewater et al.

(10) Patent No.: US 7,245,047 B2
(45) Date of Patent: Jul. 17, 2007

(54) LITHOGRAPHIC APPARATUS AND DEVICE MANUFACTURING METHOD

(75) Inventors: Patricia Vreugdewater, Eindhoven (NL); Henrikus Herman Marie Cox, Eindhoven (NL); Sven Antoin Johan Hol, Eindhoven (NL); Harmen Klaas Van Der Schoot, Vught (NL)

(73) Assignee: ASML Netherlands B.V., Veldhoven (NL)

( * ) Notice: Subject to any disclaimer, the term of this patent is extended or adjusted under 35 U.S.C. 154(b) by 450 days.

(21) Appl. No.: 10/834,359

(22) Filed: Apr. 29, 2004

(65) Prior Publication Data

US 2004/0263000 A1    Dec. 30, 2004

(30) Foreign Application Priority Data

May 1, 2003    (EP)    .................. 03252759

(51) Int. Cl.
*H02K 41/00* (2006.01)
(52) U.S. Cl. .......................................... 310/12; 355/53
(58) Field of Classification Search .................. 310/12; 355/53, 55
See application file for complete search history.

(56) References Cited

U.S. PATENT DOCUMENTS

| | | | |
|---|---|---|---|
| 5,196,745 A | 3/1993 | Trumper | |
| 6,066,998 A | 5/2000 | Trumper et al. | |
| 6,097,114 A | 8/2000 | Hazelton | |
| 6,353,271 B1 * | 3/2002 | Williams | 310/12 |
| 6,437,463 B1 | 8/2002 | Hazelton et al. | |
| 2001/0004105 A1 | 6/2001 | Kwan et al. | |
| 2004/0252287 A1 * | 12/2004 | Binnard et al. | 255/53 |
| 2005/0024610 A1 * | 2/2005 | Nishi et al. | 355/53 |
| 2005/0162635 A1 * | 7/2005 | Binnard | 355/72 |
| 2005/0168076 A1 * | 8/2005 | Hazelton | 310/12 |

* cited by examiner

*Primary Examiner*—Thanh Lam
(74) *Attorney, Agent, or Firm*—Pillsbury Winthrop Shaw Pittman LLP

(57) ABSTRACT

A lithographic projection apparatus includes a conduit shuttle used to at least partly support conduits which provide utilities to moveable objects. The conduit shuttle has an actuator which is positionable with six degrees of freedom. The actuator comprises a 2-phase or 3-phase motor with one degree of freedom and a Lorentz actuator with five degrees of freedom.

21 Claims, 5 Drawing Sheets

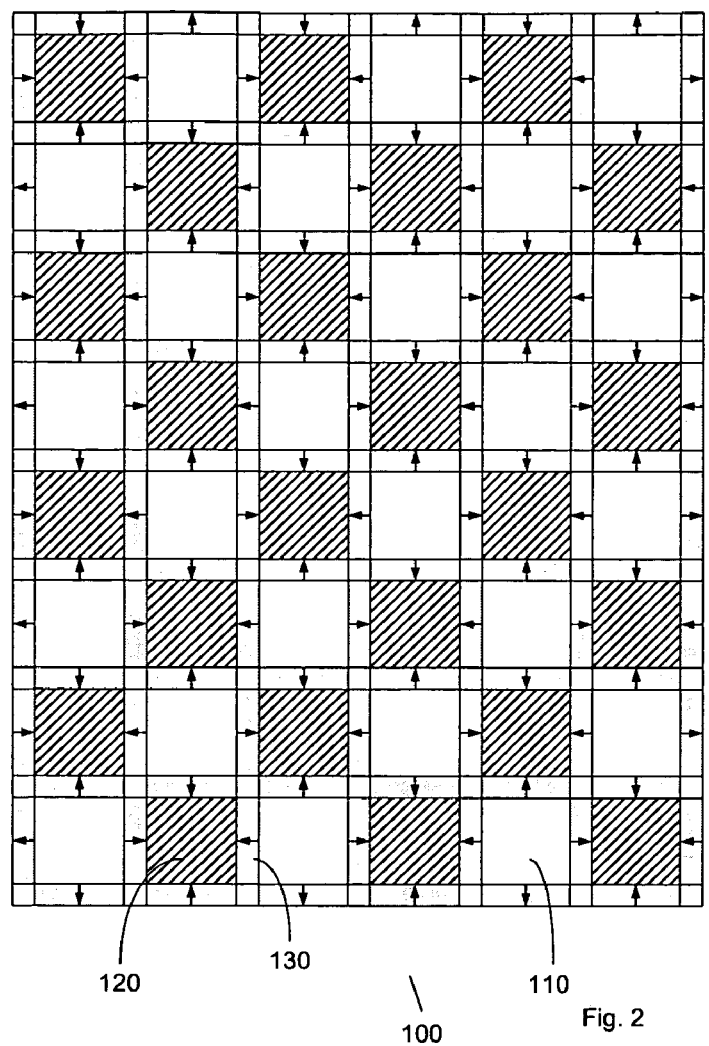
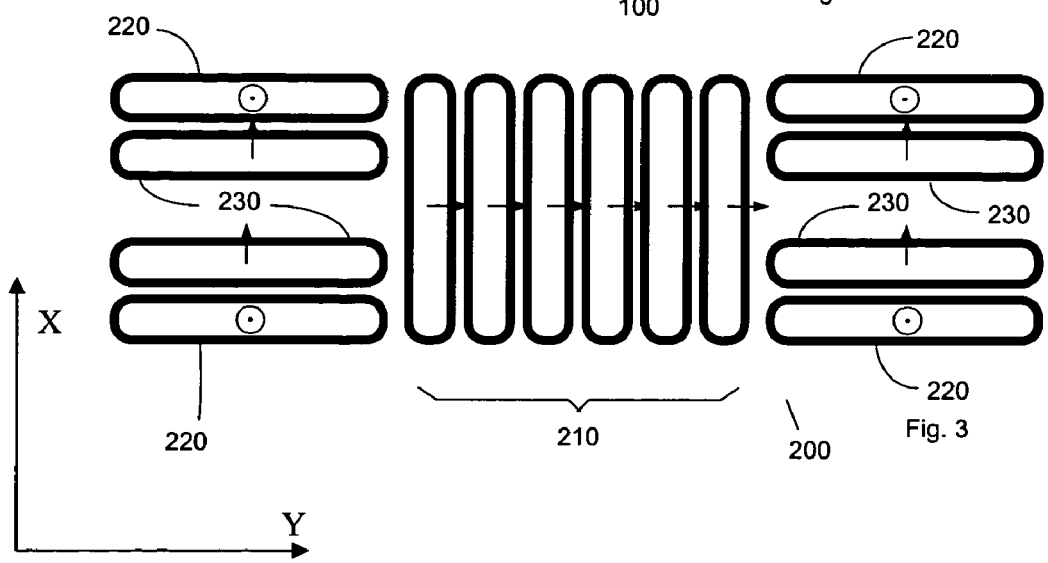
Fig. 2
Fig. 3

LITHOGRAPHIC APPARATUS AND DEVICE MANUFACTURING METHOD

BACKGROUND OF THE INVENTION

1. Field of the Invention

The present invention relates to a lithographic projection apparatus and a device manufacturing method.

2. Description of the Related Art

The term "patterning device" as here employed should be broadly interpreted as referring to a device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device includes a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such a device is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can include one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, the contents of all of which are incorporated by reference. In the case of a programmable mirror array, the support may be embodied as a frame or table, for example, which may be fixed or movable as required.

Another example of the patterning device is a programmable LCD array. An example of such a construction is given in U.S. Pat. No. 5,229,872, hereby incorporated by reference. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. including one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, hereby incorporated by reference.

In a manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. Nos. 5,969,441 and 6,262,796, both of which are hereby incorporated by reference.

The various moveable objects in a lithographic projection apparatus, such as stages, actuators, etc., require utilities such as water, gas, electrical power and control signals to be provided to them. The utilities are provided to the objects through conduits, such as cables and tubes. The term "conduits" refers to such items as power cords, signal carriers, gas tubes (e.g. for supplying gas to a gas bearing in the table), vacuum tubes, coolant tubes, etc. Moveable objects inside the vacuum chamber, for example the mask table, substrate table, associated motors, balance masses and sensors, may be connected to the frame of the lithographic projection device via their conduits (using a distinct conduit conduct for each component if necessary).

In order that the conduits do not sag, wear or interfere with the movement of the moveable objects, it is desirable to support the conduits and provide a so called "conduit shuttle" for at least partly supporting the conduits. The conduit shuttle typically requires a separate drive in order to reduce disturbance forces that cause positioning accuracy problems on the mask or wafer stage. The actuator generally is only responsible for long/stroke movement in a single degree of freedom, but a bearing or guiding system is required with five degrees of freedom.

The mask stage must be movable over a large stroke in the scan direction. The total drive of the mask stage can be formed by a single high precision motor that has a large stroke in the scan direction in combination with a 5 DOF small stroke actuation in the non-scan direction with a position accuracy of approximately <10 nm.

It is very difficult to build a high precision motor that is movable over a large stroke, so the "short stroke, long stroke principle" is generally applied. In this configuration the short stroke is a high precision 6 DOF Lorentz actuator that drives the mask/substrate table containing the mask/substrate.

This short stroke motor is superimposed on a coarse long stroke motor to enable a large motion in scan-direction. The long stroke motor can be designed less accurate than the short stroke motor. Typically, the long stroke position accuracy is approximately 10-500 μm.

SUMMARY OF THE INVENTION

It is an aspect of the present invention to provide an actuator which provides long-stroke movement in one degree of freedom and short stroke and bearing in the remaining five degrees of freedom. Preferably the actuator is low in both weight and volume and is vacuum compliant.

This and other aspects are achieved according to the invention in a lithographic apparatus including, a radiation system configured to supply a beam of radiation; a support configured to support a patterning device, the patterning device configured to pattern the beam according to a desired pattern; a substrate table to hold a substrate; and a projection system configured to project the patterned beam onto a target portion of the substrate; and an actuator configured to drive an object in six degrees of freedom, wherein the actuator includes a five degrees of freedom Lorentz actuator and a one or two degree of freedom 2-phase or 3-phase motor.

In this way, large stroke movement in a single degree of freedom is possible through use of the 2 or 3-phase motor and the Lorentz actuator allows minor displacements in the other five degrees of freedom to be controlled to act as a bearing. Because only minor displacements are required in the other five degrees of freedom, non-commutation actuators, such as Lorentz actuators, can be applied instead of a commutating 2-phase or 3-phase motor. Such a system is easily made vacuum compliant and requires relatively little volume because the Lorentz actuator and the 2-phase or 3-phase motor may share a common magnet matrix stator.

Preferably, the actuator has a Halbach magnet matrix stator common to both the linear motor and the 2-phase or 3-phase motor. This arrangement, resulting in a high magnetic flux, reduces the volume of the actuator as well as reducing the production cost.

In an exemplary embodiment, the actuator has a planar coil assembly armature (translator) comprising coils for both the Lorentz actuator and the 3-phase motor. Thus, the combination of the separate large stroke motor (Y-drive) and five degrees of freedom magnetic bearing is accomplished in one configuration. Gravity compensation can be included by adding some extra ferromagnetic material (back iron).

According to a further aspect of the invention there is provided a device manufacturing method including providing a substrate that is at least partially covered by a layer of radiation-sensitive material; projecting a patterned beam of radiation onto a target portion of the layer of radiation-sensitive material; and positioning an object using an actuator with six degrees of freedom; wherein the actuator includes a five degrees of freedom Lorentz actuator and a one or two degree of freedom 2-phase or 3-phase motor.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. It should be appreciated that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams.

BRIEF DESCRIPTION OF THE DRAWINGS

Embodiments of the present invention will now be described, by way of example only, with reference to the accompanying schematic drawings in which:

FIG. 2 illustrates in plan a Halbach magnetic matrix stator;

FIG. 3 illustrates in plan the coil configuration of the six degrees of freedom conduit shuttle armature;

In the Figures, corresponding reference symbols indicate corresponding parts.

DETAILED DESCRIPTION

Figure 1:
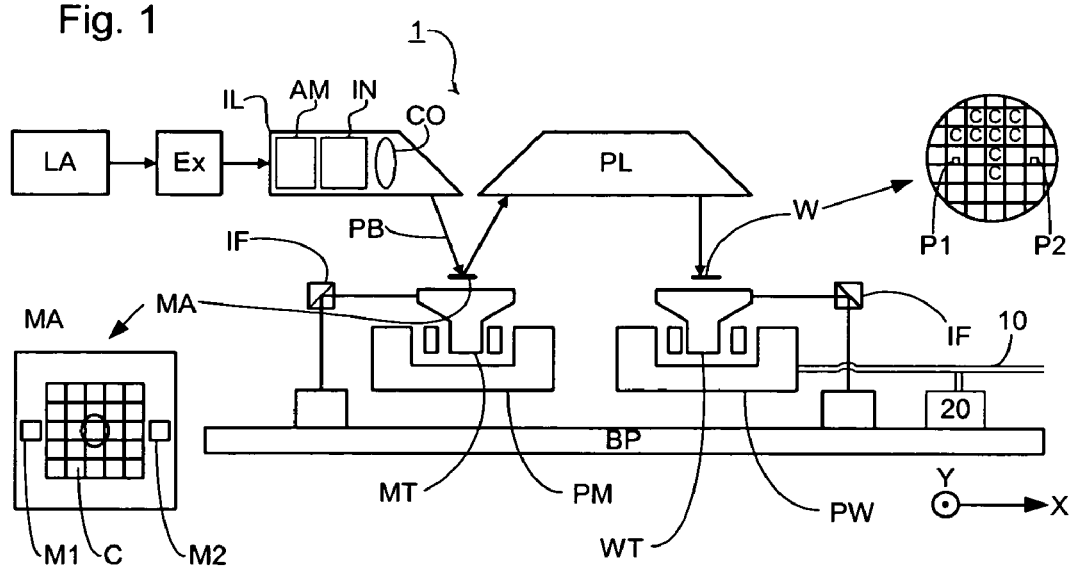
FIG. 1 depicts a lithographic projection apparatus according to an embodiment of the present invention.

FIG. 1 schematically depicts a lithographic projection apparatus according to an exemplary embodiment of the present invention. The apparatus includes a radiation system Ex, IL, configured to supply a beam PB of radiation (e.g. radiation), which in this particular case also includes a radiation source LA. A first object table (mask table) MT is provided with a mask holder to hold a mask MA (e.g. a reticle), and is connected to first positioning device PM that accurately positions the mask with respect to a projection system ("lens") PL. A second object table (substrate table) WT is provided with a substrate holder to hold a substrate W (e.g. a resist-coated silicon wafer), and is connected to second positioning device PW that accurately positions the substrate with respect to the projection system PL. The projection system ("lens") PL (e.g. mirror group) images an irradiated portion of the mask MA onto a target portion C (e.g. including one or more dies) of the substrate W.

As here depicted, the apparatus is of a reflective type (e.g. has a reflective mask). However, in general, it may also be of a transmissive type, for example (e.g. with a transmissive mask). Alternatively, the apparatus may employ another kind of patterning device, such as a programmable mirror array of a type as referred to above.

The source LA (e.g. a laser-produced or discharge plasma source) produces radiation. This radiation is fed into an illumination system (illuminator) IL, either directly or after having traversed conditioning device, such as a beam expander Ex, for example. The illuminator IL may includes an adjusting device AM to set the outer and/or inner radial extent (commonly referred to as σ-outer and σ-inner, respectively) of the intensity distribution in the beam. In addition, it will generally include various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on the mask table MT. Having been selectively reflected by the mask MA, the beam PB passes through the projection system PL, which focuses the beam PB onto a target portion C of the substrate W. With the aid of the second positioning device (and interferometric measuring device IF), the substrate table WT can be moved accurately, e.g. so as to position different target portions C in the path of the beam PB. Similarly, the first positioning device PM (and interferometric measuring device IF) can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

As is illustrated in FIG. 1 the second positioning device PW is supplied with utilities such as air, coolant, power and signals through conduits 10. The conduits 10 may include wires, pipes, tubes etc. The conduits 10 are supported at one end by the second positioning device PW and at the other end to whatever they are attached, for example to the side of a vacuum chamber wall. Between the two ends of the conduit 10, the conduit is also supported by a conduit shuttle 20. In this way the conduit shuttle 20 takes at least some of the weight of the conduits 10.

When the second positioning device PW moves in the lithographic projection apparatus (for example in a vacuum chamber) the conduits 10 are also required to move with the second positioning device PW. In order to minimize wear and sagging of the conduits 10, as well as minimizing the disturbance forces transmitted by the conduits 10 to the second positioning device PW, the conduit shuttle 20 copies the long stroke movement of the second positioning device PW in the Y direction as illustrated, i.e. with one degree of freedom. The conduit shuttle 20 can also move, to a more limited extent, in the other 5 degrees of freedom such that the conduit shuttle 20 acts as a five degrees of freedom bearing.

The conduit shuttle 20 is positioned using an actuator which has six degrees of freedom. The actuator comprises a Lorentz actuator which has 5 degrees of freedom and a 2-phase or 3-phase motor with one degree of freedom. The stator 100 of the conduit shuttle actuator is illustrated in FIG. 2 and the armature 200 of the conduit shuttle actuator is illustrated in FIG. 3. The stator 100 and armature 200 are described in detail below.

The stator 100 of the conduit shuttle actuator is preferably comprised of a Halbach magnetic matrix. The Halbach magnetic matrix is known and, as can be seen from FIG. 2, includes a plurality of square major magnets 110, 120 which are arranged in a checker board format. Major magnets 110, 120 which are adjacent in the horizontal and vertical directions when the edges of the square are horizontal or vertical, i.e. oriented as illustrated in FIG. 2, are polarized in opposite directions in and out of the plane of the matrix such that the (white) major magnets 110 illustrated in FIG. 2 are polarized in a direction into the paper whereas the major magnets labeled 120 in FIG. 2 are polarized in a direction out of the paper. Thus, each major magnet 110, 120 is surrounded horizontally and vertically by major magnets polarized in the opposite direction and diagonally by magnets polarized in the same direction.

Each of the major magnets 110, 120 has on each of its four edges, associated minor magnets 130 which are either polarized towards the centre of the associated major magnet or away from the centre of the major magnets 110, 120 according to whether the major magnet is polarized out of or into the plane of the magnet matrix.

The armature 200 illustrated in FIG. 3 comprises a plurality of coils which are assembled substantially in the same plane, though this need not be the case. All of the coils 210, 220, 230 are each oriented such that the conductor of the coil is wound around an axis substantially perpendicular to the plane of the planar coil assembly, though this may not be the case. The coils 210, 220, 230 can all be in the same plane. This results in a very compact stator and, as will be described below, allows long stroke movement in one degree of freedom and short stroke movement and bearing in the remaining five degrees of freedom.

Coils 210 in the center of the coil assembly 200 are driven as a 3-phase motor by a control unit for large stroke movement in the Y direction. The coils 210 can also be used to exert forces in the Z direction. In a preferred embodiment, the 3-phase motor coils 210 include six coils—two sets of three. It is also possible to use a single set of three coils or three or more sets. A 2-phase motor with one or more sets of two coils can also be used. Positioned at four corners of the coil assembly 200 are a coil each for movement in orthogonal directions, namely in the X and Z. These two sets of four coils 220, 230 are driven as Lorentz actuators such that the coil assembly is moveable with five degrees of freedom. This allows the actuator to act as a bearing. The two sets of four coils 220, 230 may be replaced by three sets of coils. In such arrangement, each set of coils may include two or more coils. All actuators may be in the same plane and all act between the same objects. The different coil sets of the Lorentz actuator can be powered by a DC current voltage source. Because only minor displacements are required in X and Z-direction, the magnetic field that interacts with the Lorentz actuator remains substantially constant. Therefore, no commutation of the power supply of the Lorentz actuator is required. When combined with a position sensor and a control feedback loop, the coils 210 may also actuate in directions perpendicular to the long stroke direction.

The actuator can be used anywhere in a lithographic projection apparatus and is particularly suited to tasks which require large stroke movement in a single degree of freedom and small stroke actuation and/or bearing in the other five degrees of freedom. The actuator can easily be made vacuum compliant and so is suited to vacuum environments.

Figure 4:
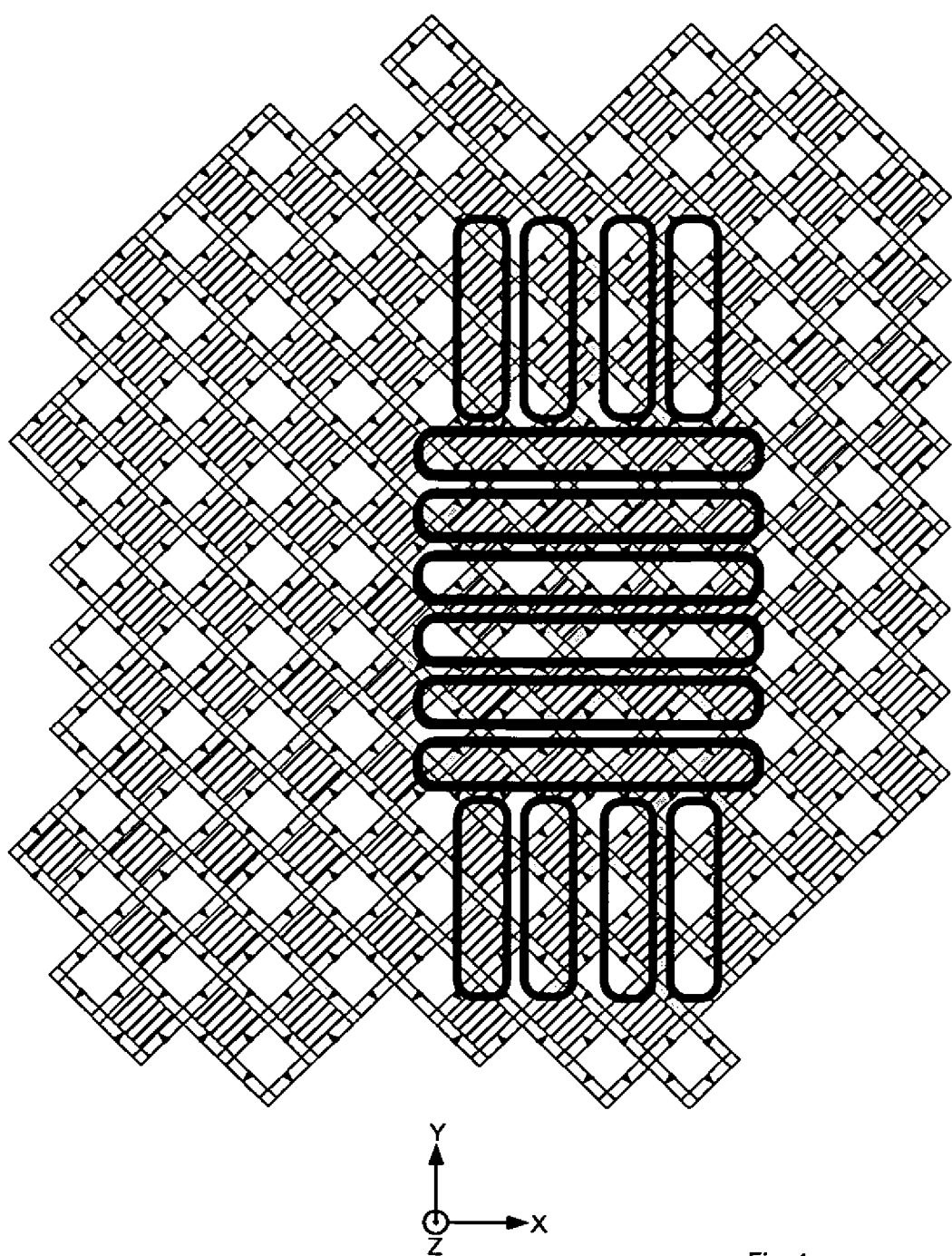
FIG. 4 illustrates the relative positioning of the armature and stator of the six degrees of freedom actuator.

FIG. 4 illustrates how the stator 100 and the armature 200 are positioned relative to each other in use. As can be seen from FIG. 4 it is important that the coil assembly 200 is positioned over the Halbach magnetic matrix 100 substantially at 45 degrees to the direction of polarization of the minor magnets 130. Of course, in use, there will be minor deviations from this position as the coil assembly is moved relative to the magnetic matrix. Other geometries will also work. As will be appreciated, on translation in the Y direction by the three-phase motor, the coils of the Lorentz actuators remain above major magnets 110, 120 of the same polarisation. Due to this, a non-commutation power supply can be applied. Long stroke displacement in the Y direction may be up to 2.0 m or more whereas short stroke in the other directions may be only a few millimeters (about 0.1 to 5 mm).

It will be appreciated that other coil and magnet configurations could be used, though the coil configuration as herein described is desirable as it has a low total coil assembly height and low magnet volume. It will be apparent that gravity compensation with extra ferromagnetic material or electro magnets or permanent magnets can be integrated into this system as can air pistons, springs, etc.

Figure 5:
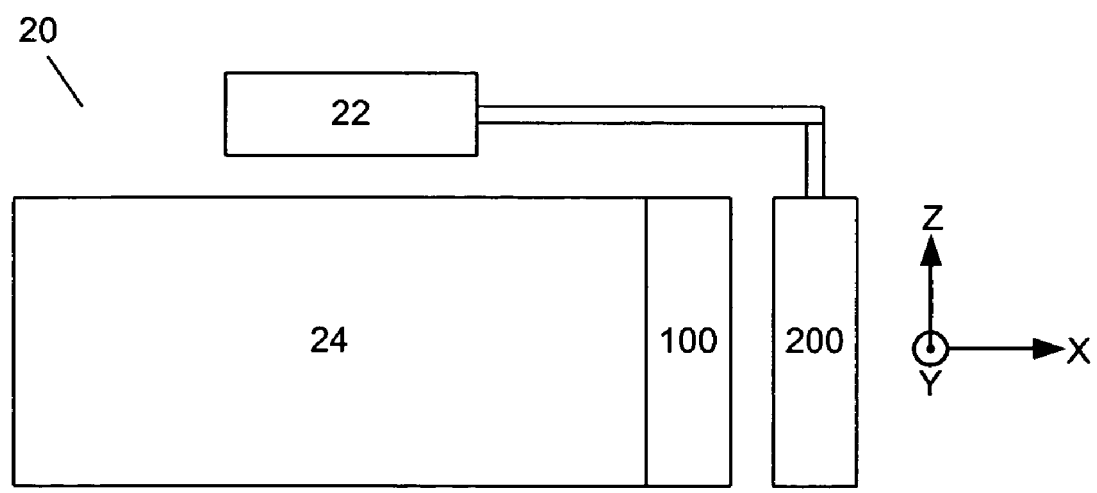
FIG. 5 illustrates the positioning of the actuator between a balance mass and the conduit shuttle according to an exemplary embodiment of the present invention.

FIG. 5 shows how the actuator is to be incorporated into the conduit shuttle 20. Of course other arrangements are possible, for example arrangements which do not use a balance mass. However, it is envisaged that the conduit shuttle 20 will include a balance mass 24 to which is attached the magnetic matrix stator 100. A conduit support member 22 is attached to the coil assembly armature 200 such that the conduit support member 22, e.g. a mask or substrate stage, is moveable by generation of a reaction force between the coil assembly 200 and the stator 100. The balance mass 24 is provided with bearings on its underside (such as air bearings or mechanical flexures) as is known in the art. It is believed that the arrangement where the plane of the magnetic matrix stator 100 and the coil assembly armature 200 are vertically orientated, in use, is the most efficient use of space. In this way large stroke movement in the Y direction (in and out of the plane of the paper) is easily achieved and the five degrees of freedom of the Lorentz actuator comprising the magnetic matrix 100 and the coils 220, 230 allows non-commutated bearing. But other orientations may be more desirable depending on machine layout.

Figure 6:
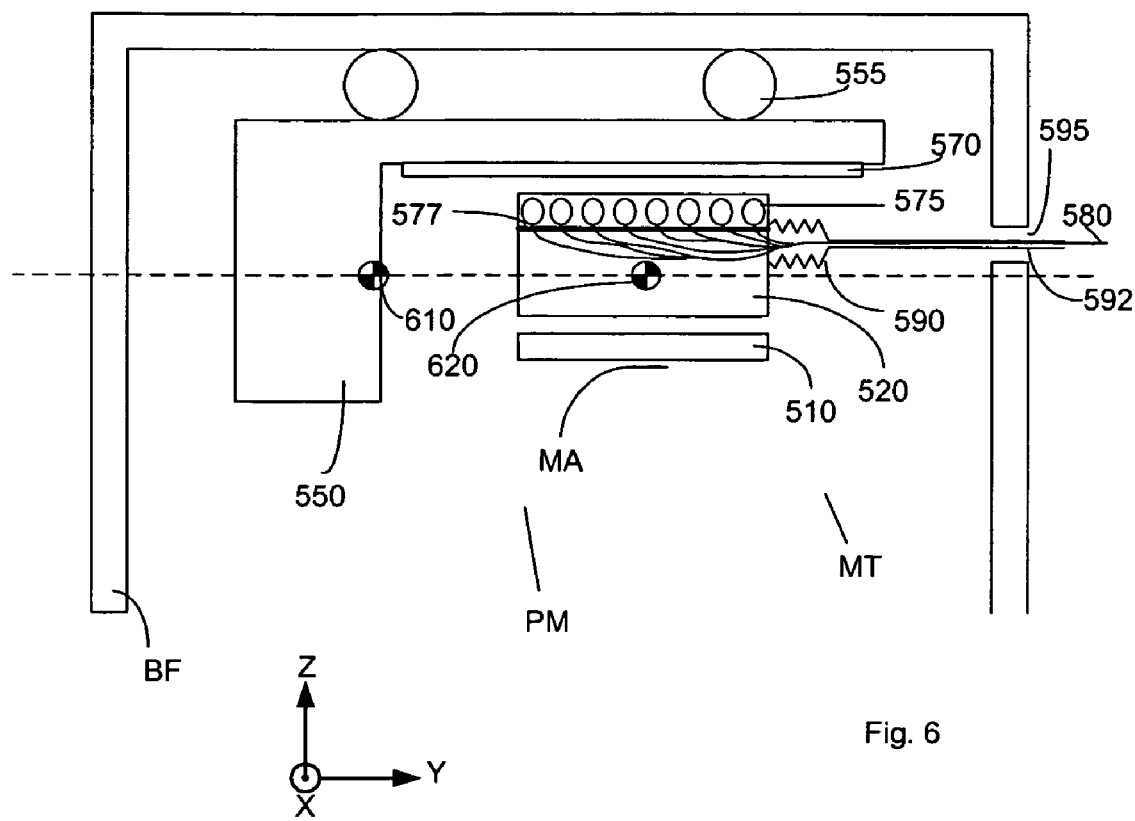
FIG. 6 illustrates the arrangement of the actuator when used between the mask table and balance mass in a lithographic projection apparatus.

FIG. 6 illustrates a further use of the actuator to position the mask MA in the lithographic projection apparatus.

The first positioning device PM includes a balance mass 550 and a mask table or support MT. A force generated between the balance mass 550 and the mask table MT by the actuator of the present invention results in movement of the mask table MT and balance mass 550 and thus the positioning of the mask MA within the lithographic projection apparatus.

The balance mass 550 is suspended from a base frame BF of the lithographic projection apparatus to which the second positioning device PW is also connected. The suspension 555 of the balance mass 550 may be an air bearing with differential vacuum seals, or a flexible coupling, or any other way.

The mask table MT includes first and second portions 510, 520. The second portion 520 is positionable with 6 degrees of freedom by a one degree of freedom large stroke motor and a five degree of freedom small stroke actuator. Small stroke movements are accomplished by relative movement of the first portion 510 to the second portion 520 in six degrees of freedom with 6 small stroke Lorentz motors and the mask MA is held on the first portion 510.

The actuator of the present invention is positioned between the balance mass 550 and the second portion 520 of the mask table MT with the Halbach magnetic array 570 being attached to the balance mass 550 and the actuator coils 575 being attached to the second portion 520 of the mask table MT. The magnetic array 570 and the coils 575 of the first positioning device PM are of the same overall construction as the actuator described earlier and as illustrated in FIGS. 2, 3 and 4, though they may be of different dimensions, different number of coils and magnets, etc. Although in a preferred embodiment the magnetic array 570 is attached to the balance mass 550 and the coils 575 are attached to the second portion 520 of the mask table MT, the location of those members may be the other way around.

Preferably, the actuator is designed such that upon a power failure the mask table MT is attracted to the balance mass 550 such that it does not fall. This can be achieved by provision of iron 577 or other ferromagnetic material, including just the coils already present, on the mask table MT.

The use of this actuator is desirable in this situation because it allows five degree of freedom contactless position control in the Z, Rx, Ry and X, Rz directions in combination with a 2-phase or 3-phase horizontal (Y) motor. Large stroke actuation in the Y direction is easily achieved using the 2-phase or 3-phase motor of the actuator. Bearing is achieved using the Lorentz actuators.

The centers of gravity of the balance mass 550 and the mask table MT are illustrated at 610 and 620 respectively. It is desirable for those centers of gravity 610, 620 to be in the same horizontal plane such that relative movement of the balance mass 550 and the mask table MT does not translate into a torque on the base frame BF.

There may be actuators, springs or dampers positioned between the base frame BF and the balance mass 550 to counteract any drift of the balance mass 550 of the first positioning device PM assembly which may occur during use. Movement in the Y direction (i.e. in the degree of freedom of the two or three phase motor) is about 400-2000 mm and could be 1 to 2 m.

Utilities are provided to the mask table MT through conduits 580. The conduits are shielded from the vacuum by being positioned in a pipe 592 and bellows 590 arrangement and a vacuum differential seal 595 allows the pipe 592 in which the conduits are positioned to move relative to the base frame BF which forms part of a vacuum chamber wall. The flexibility provided by the bellows 590 provides freedom of movement such that the mask table MT is not unduly constrained by the pipe 592. An alternative to the bellows 590 and the pipe 592 arrangement would be the covering of the conduits 580 by positioning them in flexible tubing or cabling.

While specific embodiments of the invention have been described above, it will be appreciated that the invention may be practiced otherwise than as described. The description is not intended to limit the invention.

What is claimed is:

1. A lithographic projection apparatus, comprising:
   a support configured to support a patterning device, the patterning device configured to pattern a beam of radiation according to a desired pattern;
   a substrate table configured to hold a substrate;
   a projection system configured to project the patterned beam onto a target portion of the substrate; and
   an actuator configured to drive an object in six degrees of freedom, wherein the actuator comprises a five degrees of freedom small stroke Lorentz actuator and a one or two degree of freedom 2-phase or 3-phase motor.

2. A lithographic projection apparatus according to claim 1, wherein the actuator has a magnet matrix stator common to both the Lorentz actuator and the 2-phase or 3-phase motor.

3. A lithographic projection apparatus according to claim 2, wherein coils of the Lorentz actuator and the two-phase or three-phase motor are at 45° to the axis of the magnet matrix stator.

4. A lithographic projection apparatus according to claim 3, wherein the coils and stator are arranged such that during movement in the one degree of freedom of the 2-phase or 3-phase motor, the coils of the Lorentz actuator substantially remain over magnets of the stator of the same polarity.

5. A lithographic projection apparatus according to claim 1, wherein the actuator has a planar coil assembly armature comprising coils for both the linear actuator and the 2-phase or 3-phase motor.

6. A lithographic projection apparatus according to claim 5, wherein the coil assembly comprises a central set of coils which are part of the 2-phase or 3-phase motor.

7. A lithographic projection apparatus according to claim 5 or 6, wherein the coil assembly comprises two sets of four coils, each set of four coils being for movement in one of two orthogonal directions and being part of the Lorentz actuator.

8. A lithographic projection apparatus according to claim 5, wherein the coil assembly comprises three sets of two coils, each set of two coils being for movement in one of two orthogonal directions and being part of the Lorentz actuator.

9. A lithographic projection apparatus according to claim 1, further comprising:
   a conduit configured to supply a utility to the object; and
   a conduit shuttle configured to at least partly support the conduit, the conduit shuttle being positionable by the actuator.

10. A lithographic projection apparatus according to claim 9 further comprising a balance mass associated with the conduit shuttle, wherein the actuator is partly assembled on the balance mass and partly assembled on the conduit shuttle.

11. A lithographic projection apparatus according to claim 9 wherein the conduit is configured to supply the utility to a positioning device of the substrate table, or the support, or both.

12. A lithographic projection apparatus according to claim 1, wherein the actuator is configured to generate a reaction force between a balance mass and the support or the substrate table thereby to position the support or the substrate table.

13. A lithographic projection apparatus according to claim 12, wherein, in use, the center of gravity of the balance mass and the center of gravity of the support are substantially in the same horizontal plane.

14. A lithographic projection apparatus according to claim 1, wherein the actuator further comprises a ferromagnetic member to ensure attraction between a stator and armature when the actuator is de-activated.

15. A lithographic projection apparatus according to claim 1, wherein the actuator, in use, is orientated such that a gap between an armature and a stator is substantially planar and either vertical or horizontal.

16. A lithographic projection apparatus according to claim 1, wherein the object comprises the support.

17. A lithographic projection apparatus, comprising:
   a support configured to support a patterning device, the patterning device configured to pattern a beam of radiation according to a desired pattern;
   a substrate table configured to hold a substrate;
   a projection system configured to project the patterned beam onto a target portion of the substrate; and
   an actuator configured to drive the support in six degrees of freedom, wherein the actuator comprises:
   a one or two degree of freedom 2-phase or 3-phase motor used at least to move the support in a primarily long stroke scanning motion during projection of the patterned beam, and
   a five degrees of freedom small stroke Lorentz actuator.

18. A lithographic projection apparatus according to claim 17, wherein the actuator has a magnet matrix stator common to both the Lorentz actuator and the 2-phase or 3-phase motor.

19. A lithographic projection apparatus according to claim 17, wherein the actuator has a planar coil assembly armature comprising coils for both the linear actuator and the 2-phase or 3-phase motor.

20. A lithographic projection apparatus according to claim 17, further comprising:
- a conduit configured to supply a utility to the object; and
- a conduit shuttle configured to at least partly support the conduit, the conduit shuttle being positionable by the actuator.

21. A lithographic projection apparatus, comprising:
- a support configured to support a patterning device, the patterning device configured to pattern a beam of radiation according to a desired pattern;
- a substrate table configured to hold a substrate;
- a projection system configured to project the patterned beam onto a target portion of the substrate; and
- an actuator configured to drive the support or the substrate table in six degrees of freedom, wherein the actuator comprises a five degrees of freedom Lorentz actuator and a 2-phase or 3-phase motor.

* * * * *